United States Patent
Camacho et al.

(10) Patent No.: US 7,671,463 B2
(45) Date of Patent: Mar. 2, 2010

(54) INTEGRATED CIRCUIT PACKAGE SYSTEM WITH GROUND RING

(75) Inventors: Zigmund Ramirez Camacho, Singapore (SG); Henry D. Bathan, Jr., Singapore (SG); Arnel Trasporto, Singapore (SG); Jeffrey D. Punzalan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 309 days.

(21) Appl. No.: 11/277,991

(22) Filed: Mar. 30, 2006

(65) Prior Publication Data

US 2007/0235854 A1    Oct. 11, 2007

(51) Int. Cl.
*H01L 23/48* (2006.01)
*H01L 23/52* (2006.01)

(52) U.S. Cl. .............. 257/692; 257/E23.037; 257/666; 257/690; 257/693; 438/123; 438/112

(58) Field of Classification Search .......... 257/E23.049, 257/E23.043, E23.124, E23.037, 690, 670, 257/676, 666, 667, 674, 669, 672, 692, 693
See application file for complete search history.

(56) References Cited

U.S. PATENT DOCUMENTS

| | | | |
|---|---|---|---|
| 6,380,048 B1 * | 4/2002 | Boon et al. | 438/456 |
| 6,437,427 B1 * | 8/2002 | Choi | 257/666 |
| 6,627,977 B1 * | 9/2003 | Foster | 257/666 |
| 6,630,373 B2 * | 10/2003 | Punzalan et al. | 438/123 |
| 6,713,322 B2 * | 3/2004 | Lee | 438/123 |
| 6,713,849 B2 * | 3/2004 | Hasebe et al. | 257/667 |
| 6,825,062 B2 | 11/2004 | Yee et al. | |
| 6,828,659 B2 | 12/2004 | Iwakiri | |
| 6,853,059 B1 | 2/2005 | Jang | |
| 6,876,069 B2 | 4/2005 | Punzalan et al. | |
| 6,995,460 B1 | 2/2006 | McLellan et al. | |
| 7,049,683 B1 * | 5/2006 | Sirinorakul et al. | 257/666 |
| 7,230,323 B2 * | 6/2007 | Lee et al. | 257/670 |
| 7,242,077 B2 * | 7/2007 | Ma et al. | 257/670 |
| 2001/0035569 A1 * | 11/2001 | Shibata | 257/667 |
| 2004/0061204 A1 * | 4/2004 | Han et al. | 257/666 |
| 2004/0061205 A1 * | 4/2004 | Han et al. | 257/666 |
| 2004/0070056 A1 * | 4/2004 | Matsuzawa et al. | 257/666 |
| 2005/0263861 A1 | 12/2005 | Ahn et al. | |
| 2007/0278633 A1 * | 12/2007 | Uematsu | 257/676 |

FOREIGN PATENT DOCUMENTS

JP    05243446 A    9/1993
JP    07058143 A    3/1995

* cited by examiner

*Primary Examiner*—Chris C Chu
(74) *Attorney, Agent, or Firm*—Mikio Ishimaru

(57) ABSTRACT

An integrated circuit package system is provided forming a ring above a paddle and an external interconnect, mounting an integrated circuit die on the paddle, connecting the integrated circuit die and the external interconnect, the external interconnect and the ring, and the ring and the integrated circuit die, and encapsulating the integrated circuit die, the ring, and a portion of the external interconnect and the paddle.

20 Claims, 4 Drawing Sheets

INTEGRATED CIRCUIT PACKAGE SYSTEM WITH GROUND RING

TECHNICAL FIELD

The present invention relates generally to integrated circuit packages and more particularly to integrated circuit packages with a ground ring.

BACKGROUND ART

Modern electronics, such as smart phones, personal digital assistants, location based services devices, servers, and storage arrays, are packing more integrated circuits into an ever shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

In the electronics industry, a continuing goal has been to reduce the size of electronic devices, such as camcorders and portable telephones, while increasing performance and speed. Integrated circuit packages for complex electronic systems typically have a large number of interconnected integrated circuit chips. The integrated circuit chips are usually made from a semiconductor material such as silicon or gallium arsenide. After manufacture, the chips are typically incorporated into packages that are then mounted on printed circuit wiring boards.

Integrated circuit chip packages typically have numerous external pins that are mechanically attached by solder or a variety of other known techniques to conductor patterns on the printed circuit wiring boards.

Typically, the packages in which these integrated circuit semiconductor chips are mounted include a substrate or other chip mounting device. One example of such a substrate is a lead frame. More particularly, a lead frame is a metal frame that includes a centrally located die paddle or die pad and a plurality of peripherally-located leads that surround the die pad. The die pad mounts the semiconductor chip (or "die"). Power, ground, and/or signal leads of the lead frame are connected electrically by wire bonds to power, ground, and/or signal sites on the chip and serve as external connecting means for the chip.

After the chip is wire-bonded to the leads, the chip, the die pad, and portions of the leads are encapsulated in a plastic, an epoxy-molded compound, or a multi-part housing made of plastic, ceramic, or metal, to form the semiconductor package. The package protects the lead frame and the chip from physical, electrical, moisture, and/or chemical damage.

Some lead frame configurations, for example exposed die pad packages, include a separate ground ring structure that is supported around the periphery of the die pad and inside the inner ends of the leads. The ground ring facilitates the many bonding wire electrical connections that typically must be made to connect ground pads on the die to electrical ground connections on the lead frame.

However, lead frames designed with such a ground ring require additional clearance space (i.e., distance) between the die pad and the ground ring and between the ground ring and the inner tips of the peripherally-located leads. This clearance space is necessary for ease of manufacturing and for proper looping of the bonding wires from the die to the ground ring and from the ground ring to the lead tips. Unfortunately, this increases the lengths of the other bonding wires that connect the die to other (e.g., power and signal) leads on the lead frame.

The requirement for ground ring clearance space thus increases the net distance between the die and the lead tips. Typically, there are more wires that connect dies to the power and signal lead tips than to the ground ring and to the ground lead tips. Hence, a ground ring causes the total wire length per die to increase, which correspondingly increases costs. Not only are costs increased, but the additional wire lengths also make the wires prone to sweeping problems during molding. ("Sweeping" of the bonding wires happens during molding of the semiconductor package. Specifically, sweeping happens when the epoxy molding compound pushes the bonding wires out of position as the epoxy molding compound flows past the bonding wires. Sweeping causes bonding wires to short circuit and/or to break.).

Typically, the ground ring is coated with a metal, such as silver, to improve bonding adhesion between the wires and the ground ring. However, silver forms a weak adhesion with the encapsulation material. This may provide problems causing separation between the integrated circuit die from the die pad.

Thus, a need still remains for an integrated circuit package system providing ground ring while maximizing the integrated die size while reducing die attach separation from the die pad. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a ring above a paddle and an external interconnect, mounting an integrated circuit die on the paddle, connecting the integrated circuit die and the external interconnect, the external interconnect and the ring, and the ring and the integrated circuit die, and encapsulating the integrated circuit die, the ring, and a portion of the external interconnect and the paddle.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
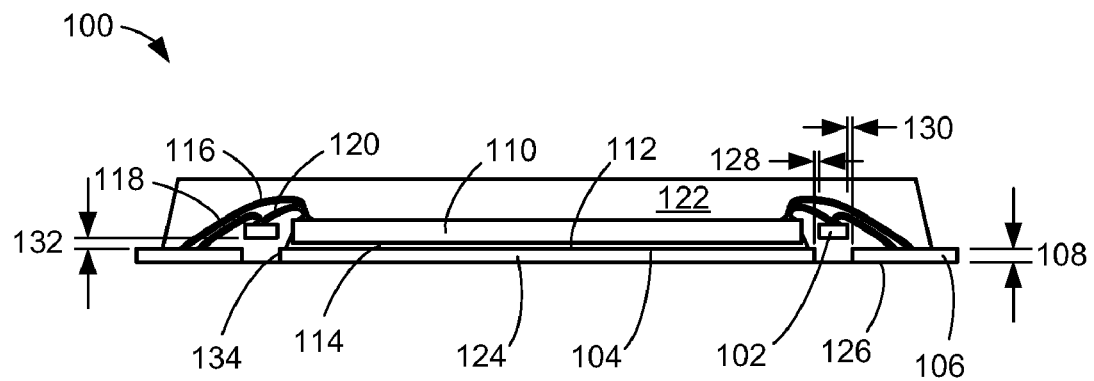
FIG. 1 is a cross-sectional view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a cross-sectional view of an integrated circuit package system 100 in an embodiment of the present invention. The cross-sectional view is along a segment line 1-1' shown in FIG. 2. The integrated circuit package system 100 includes a ring 102, such as a ground ring, elevated above the horizontal plane of a paddle 104, such as a die attach paddle, and external interconnects 106, such as leads or lead fingers. The ring 102, the paddle 104, and the external interconnects 106 are formed from a lead frame 108. An integrated circuit die 110 attaches on a paddle top surface 112 of the paddle 104 with an adhesive 114, such as a die-attach adhesive.

First interconnects 116, such as bond wires, connect the external interconnects 106 and the integrated circuit die 110. Second interconnects 118, such as bond wires, connect the external interconnects 106 and the ring 102. Third interconnects 120, such as bond wires, connect the ring 102 and the integrated circuit die 110.

An encapsulation 122, such as an epoxy mold compound (EMC), covers and protects the ring 102, the integrated circuit die 110, the first interconnects 116, the second interconnects 118, and the third interconnects 120. The encapsulation 122 also covers a portion of the paddle 104 exposing a paddle bottom surface 124 of the paddle 104. The paddle bottom surface 124 is exposed to ambient and may serve a number of functions, such as a heat sink to ambient or a connection to a next system level (not shown). The next system level may be a printed circuit board or another integrated circuit package. The encapsulation 122 also covers a portion of the external interconnects 106 exposing external interconnect bottom surfaces 126 of the external interconnects 106 for further connections.

The ring 102 is above the paddle 104 and the external interconnects 106 forming paddle-ring gaps 128 and ring-interconnect gaps 130 between the ring 102 and the paddle 104, and the ring 102 and the external interconnects 106, respectively. A ring elevation 132 of the ring 102 minimizes the keep out area for the integrated circuit die 110 to paddle edges 134 of the paddle 104 maximizing the size of the paddle 104 and allowing for larger die size range that may be mounted on the paddle 104 by keeping the paddle-ring gaps 128 to a minimum, such as close to zero. The ring-interconnect gaps 130 may also be minimized, such as minimized to close to zero, such that the length and width of the integrated circuit package system 100 is kept at a minimum.

The larger die size range allow the integrated circuit package system to be more broadly used increasing use of existing manufacturing lines, processes, materials, and equipments resulting in reduced overall cost. The bleeding from the adhesive 114 does not contaminate the ground bonds to the ring 102 due to the ring elevation 132 resulting in improved manufacturing yield and further reduced cost.

Typically, the ring 102 is plated with silver (Ag), other metals, or an alloy improving bonding adhesion between the second interconnects 118 and the ring 102. However, the silver on the ring 102 forms a weak adhesion with the material of the encapsulation 122 potentially causing separation of the encapsulation 122 and the ring 102. This separation at the ring 102 is constrained limiting the separation spread from the ring 102 to the paddle 104 reducing the likelihood of separation between the paddle 104 and the integrated circuit die 110. In other words, the separation of the encapsulation 122 from the ring 102 does not promote or reduces causing the die-attach delamination from the paddle 104.

For illustrative purpose, the external interconnects 106 are shown in a single row, although it understood that the number of rows may differ. Also for illustrative purpose, the integrated circuit die 110 is shown as a singular, although it is understood that multiple integrated circuits may be packed into the integrated circuit package system 100.

Figure 2:
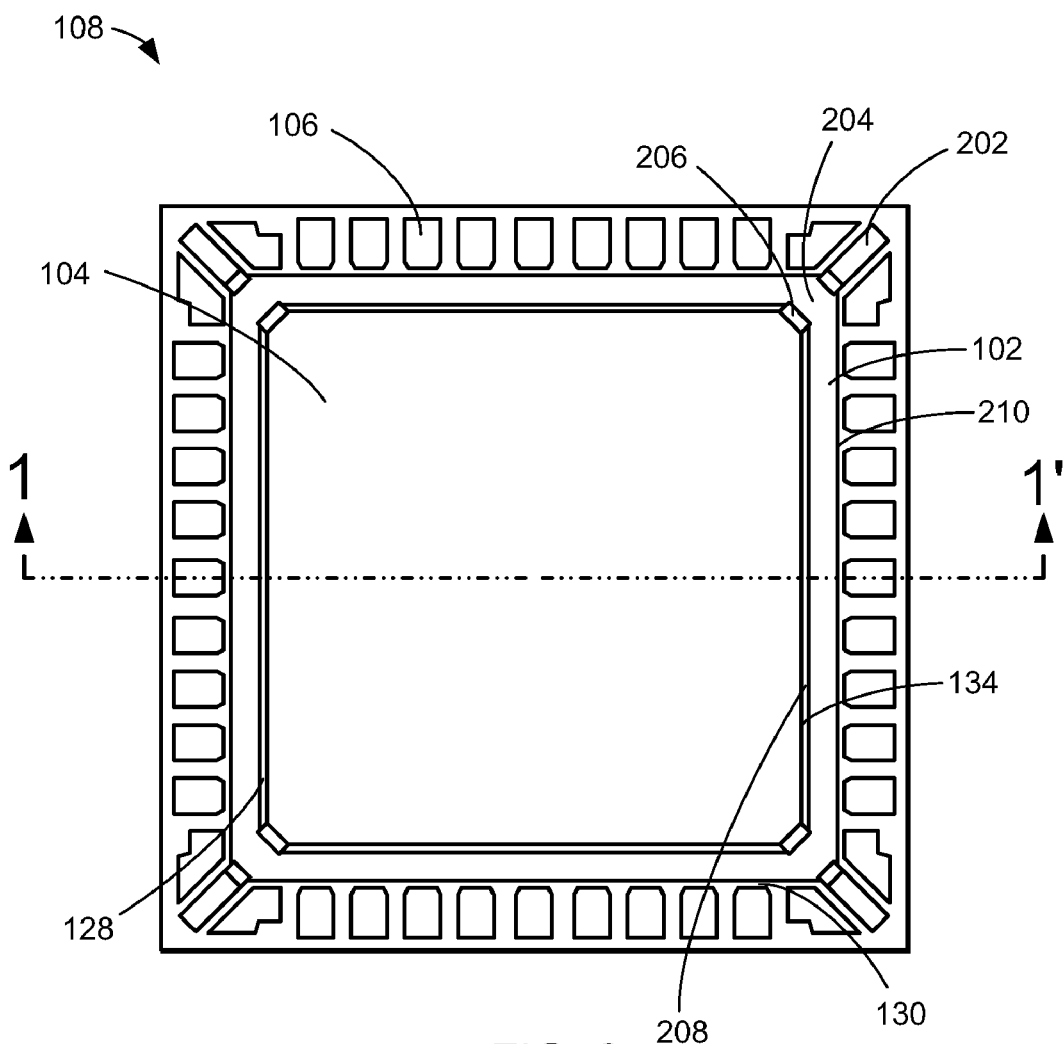
FIG. 2 is a top view of the lead frame of FIG. 1.

Referring now to FIG. 2, therein is shown a top view of the lead frame 108 of FIG. 1. The lead frame 108 includes the ring 102 between the paddle 104 and the external interconnects 106. Tie bars 202 attach to ring corners 204 of the ring 102 as well as between the ring corners 204 and paddle corners 206 of the paddle 104. The tie bars 202 provide structural support to the ring 102 and the paddle 104 withstanding the molding process.

The paddle-ring gaps 128 are shown between the paddle edges 134 and ring inner sides 208 of the ring 102. The ring-interconnect gaps 130 are shown between the external interconnects 106 and ring outer sides 210 of the ring 102. Both the paddle-ring gaps 128 and the ring-interconnect gaps 130 are shown at a minimum providing the necessary functions while minimizing the length and width of the lead frame 108 and consequently the integrated circuit package system 100 of FIG. 1.

The encapsulation 122 of FIG. 1 covers the tie bars 202, the ring 102, the paddle 104, and the external interconnects 106. The elevation of the ring 102 and the tie bars 202 also serve as a mold lock feature help to secure the encapsulation 122. The mold lock and resistance to delamination features provided by the ring 102 also improves moisture sensitivity level (MSL) test performance.

Figure 3:
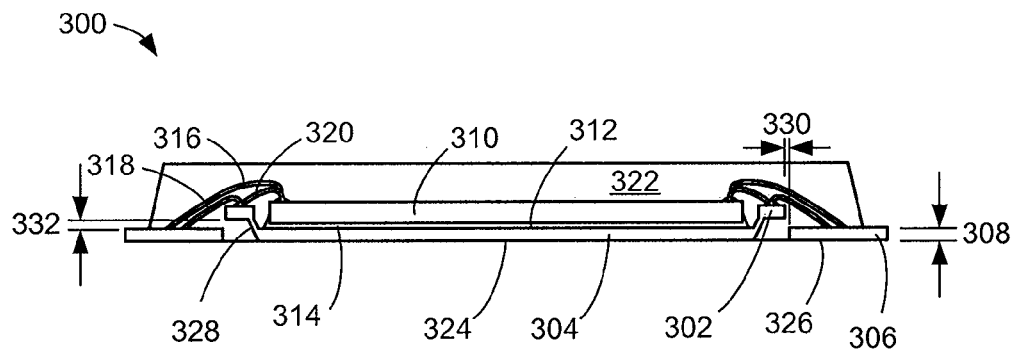
FIG. 3 is a cross-sectional view of an integrated circuit package system in an alternative embodiment of the present invention.

Referring now to FIG. 3, therein is shown a cross-sectional view of an integrated circuit package system 300 in an alternative embodiment of the present invention. The cross-sectional view is along a segment line 3-3' shown in FIG. 3. The integrated circuit package system 300 includes a ring 302, such as a ground ring, elevated above the horizontal plane of a paddle 304, such as a die attach paddle, and external interconnects 306, such as leads or lead fingers. The ring 302, the paddle 304, and the external interconnects 306 are formed from a lead frame 308. An integrated circuit die 310 attaches on a paddle top surface 312 of the paddle 304 with an adhesive 314, such as a die-attach adhesive.

First interconnects 316, such as bond wires, connect the external interconnects 306 and the integrated circuit die 310. Second interconnects 318, such as bond wires, connect the external interconnects 306 and the ring 302. Third interconnects 320, such as bond wires, connect the ring 302 and the integrated circuit die 310.

An encapsulation 322, such as an epoxy mold compound (EMC), covers and protects the ring 302, the integrated circuit die 310, the first interconnects 316, the second interconnects 318, and the third interconnects 320. The encapsulation 322 also covers a portion of the paddle 304 exposing a paddle bottom surface 324 of the paddle 304. The paddle bottom surface 324 is exposed to ambient and may serve a number of functions, such as a heat sink to ambient or a connection to a next system level (not shown). The next system level may be a printed circuit board or another integrated circuit package. The encapsulation 322 also covers a portion of the external interconnects 306 exposing external interconnect bottom surfaces 326 of the external interconnects 306 for further connections.

The ring 302 is above the paddle 304 and the external interconnects 306 forming paddle-ring bends 328 and ring-interconnect gaps 330 between the ring 302 and the paddle 304, and the ring 302 and the external interconnects 306, respectively. A ring elevation 332 of the ring 302 minimizes the keep out area for the integrated circuit die 310 maximizing the size of the paddle 304 and allowing for larger die size range that may be mounted on the paddle 304. The ring-interconnect gaps 330 may be minimized, such as minimized to close to zero, such that the length and width of the integrated circuit package system 300 is kept at a minimum.

The larger die size range allow the integrated circuit package system to be more broadly used increasing use of existing manufacturing lines, processes, materials, and equipments resulting in reduced overall cost. The bleeding from the adhesive 314 does not contaminate the ground bonds to the ring 302 due to the ring elevation 332 resulting in improved manufacturing yield and further reduced cost.

Typically, the ring 302 is plated with silver (Ag), other metals, or an alloy improving bonding adhesion between the second interconnects 318 and the ring 302. However, the silver on the ring 302 forms weak adhesion with the material of the encapsulation 322 potentially causing separation of the encapsulation 322 and the ring 302. This separation at the ring 302 is constrained limiting the separation spread from the ring 302 to the paddle 304 reducing the likelihood of separation between the paddle 304 and the integrated circuit die 310. In other words, the separation of the encapsulation 322 from the ring 302 does not promote or reduces causing the die attach delamination from the paddle 304.

For illustrative purpose, the external interconnects 306 are shown in a single row, although it understood that the number of rows may differ. Also for illustrative purpose, the integrated circuit die 310 is shown as a singular, although it is understood that multiple integrated circuits may be packed into the integrated circuit package system 300.

Figure 4:
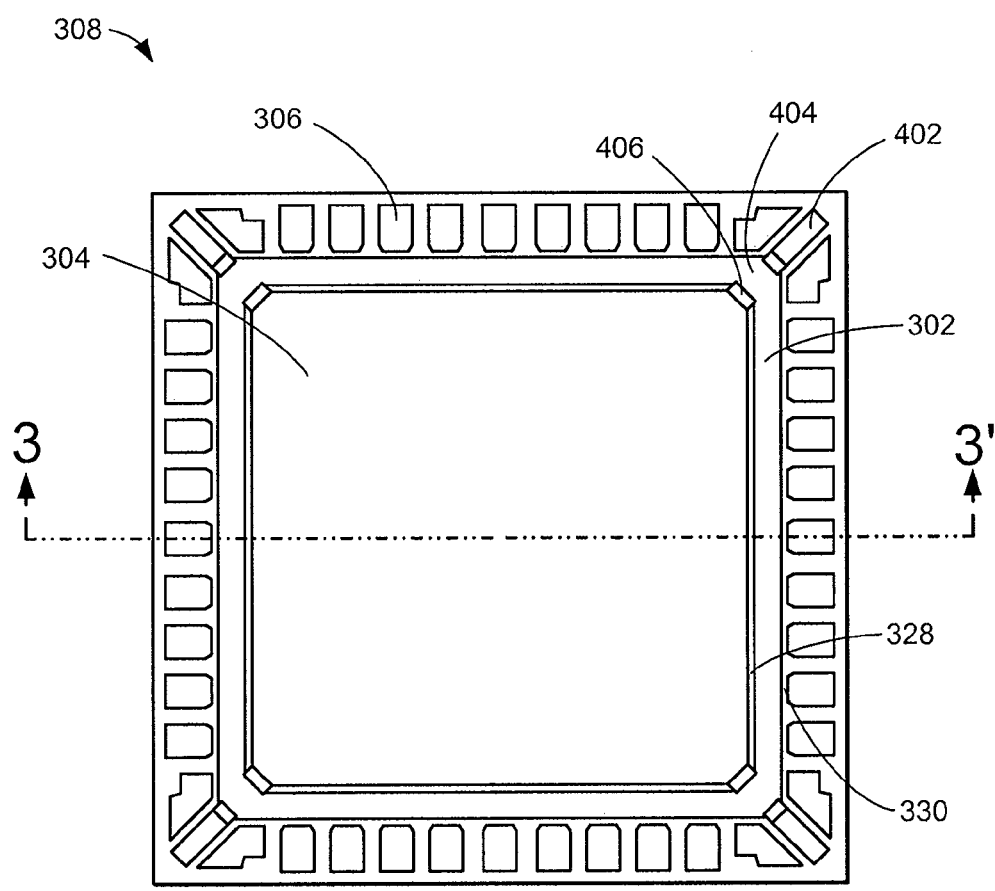
FIG. 4 is a top view of the lead frame of FIG. 3.

Referring now to FIG. 4, therein is shown a top view of the lead frame 308 of FIG. 3. The lead frame 308 includes the ring 302 between the paddle 304 and the external interconnects 306. Tie bars 402 attach to ring corners 404 of the ring 302 as well as between the ring corners 404 and paddle corners 406 of the paddle 304. The tie bars 402 provide structural support to the ring 302 and the paddle 304 withstanding the molding process.

The paddle-ring bends 328 are shown between the paddle 304 and the ring 302. The ring-interconnect gaps 330 are shown between the external interconnects 306 and the ring 302. The ring-interconnect gaps 330 are shown at a minimum providing the necessary functions while minimizing the length and width of the lead frame 308 and consequently the integrated circuit package system 300 of FIG. 3.

The encapsulation 322 of FIG. 3 covers the tie bars 402, the ring 302, the paddle 304, and the external interconnects 306. The elevation of the ring 302 and the tie bars 402 also serve as a mold lock feature help to secure the encapsulation 322. The mold lock and resistance to delamination features provided by the ring 302 also improves moisture sensitivity level (MSL) test performance.

Figure 5:
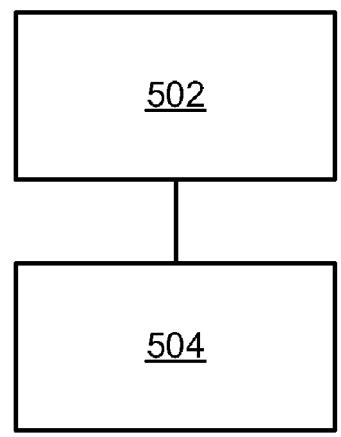
FIG. 5 is a flow chart of a portion of a manufacturing system for a lead frame process system in an embodiment of the present invention.

Referring now to FIG. 5, therein is shown a flow chart of a portion of a manufacturing system 500 for a lead frame process system in an embodiment of the present invention. The manufacturing system 500 includes punching a lead frame to form an elevated region in a block 502; and chemically etching the lead frame to form a ground ring with the elevation region as well as to form a die paddle, paddle-ring gaps, and leads in a block 504.

Figure 6:
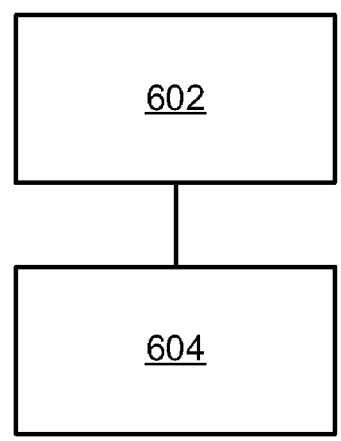
FIG. 6 is a flow chart of a portion of another manufacturing system for a lead frame processing system in an alternative embodiment of the present invention.

Referring now to FIG. 6, therein is shown a flow chart of a portion of another manufacturing system 600 for a lead frame processing system in an alternative embodiment of the present invention. The manufacturing system 600 includes etching a lead frame to form leads and to isolate the leads from a die paddle in a block 602; and punching the die paddle at the boundary to form an elevated ground ring in a block 604.

Figure 7:
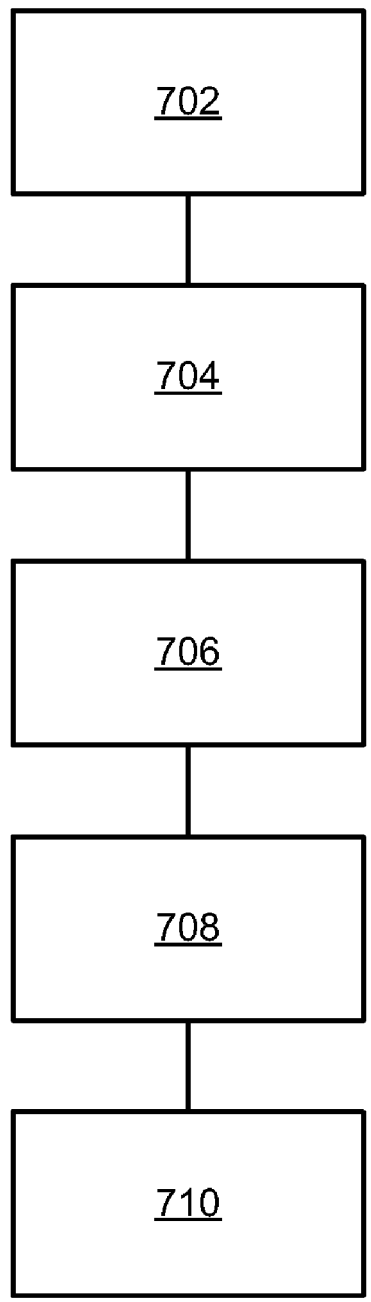
FIG. 7 is a flow chart of an integrated circuit package system for manufacture of the integrated circuit package system in an embodiment of the present invention.

Referring now to FIG. 7, therein is shown a flow chart of an integrated circuit package system 700 for manufacture of the integrated circuit package system 100 in an embodiment of the present invention. The system 700 includes forming a ring above a paddle and an external interconnect in a block 702; forming a second integrated circuit package having a second peripheral contact in a block 704; mounting an integrated circuit die on the paddle in a block 706; connecting the integrated circuit die and the external interconnect, the external interconnect and the ring, and the ring and the integrated circuit die in a block 708; and encapsulating the integrated circuit die, the ring, and a portion of the external interconnect and the paddle in a block 710.

It has been discovered that the present invention thus has numerous aspects.

It has been discovered that the present invention provides an integrated circuit package with reduce package dimensions while improving manufacturing yields and MSL test performance as well as lowering overall manufacturing cost by elevating the ground ring above the die paddle.

An aspect is that the present invention provides the elevated ground ring maximizes the die paddle size allowing a larger range of die sizes that may be accommodated on the die paddle. This allows this package solution to address a broader market need allowing manufacturers to more amortized investments in equipments, materials, and manufacturing lines. This contributes to lower overall package cost.

Another aspect of the present invention is that the elevated ground ring reduces or limits die attach delamination improving manufacturing yield and further reducing overall package cost.

Yet another aspect of the present invention is that the elevated ground ring also provides a mold lock feature. This allows improved performance in MSL tests resulting in improved reliability and further lowered overall package cost.

Thus, it has been discovered that the integrated circuit package system method of the present invention furnishes important and heretofore unknown and unavailable solutions, capabilities, and functional aspects for improving thermal performance and reliability in systems. The resulting processes and configurations are straightforward, cost-effective, uncomplicated, highly versatile and effective, can be implemented by adapting known technologies, and are thus readily suited for efficiently and economically manufacturing stacked integrated circuit package-in-package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A method of manufacture of an integrated circuit package system comprising:
    forming a ring with a ring elevation above a paddle and above an external interconnect forming paddle-ring and ring-interconnect gaps of substantially zero between the ring and the paddle, and the ring and the external interconnect, respectively;
    mounting an integrated circuit die on the paddle;
    connecting the integrated circuit die and the external interconnect, the external interconnect and the ring, and the ring and the integrated circuit die; and
    encapsulating the integrated circuit die, the ring, and a portion of the external interconnect and the paddle.

2. The method as claimed in claim 1 wherein forming the ring above the paddle and the external interconnect includes forming a paddle-ring gap between a paddle edge and a ring inner side.

3. The method as claimed in claim 1 wherein forming the ring above the paddle and the external interconnect includes forming a paddle-ring bend between a paddle edge and a ring inner side.

4. The method as claimed in claim 1 wherein forming the ring above the paddle and the external interconnect comprises:
    punching a lead frame to form an elevated region; and
    chemically etching the lead frame to form the ring with the elevated region, the paddle, a paddle-ring gap between a paddle edge and a ring inner side, and the external interconnect.

5. The method as claimed in claim 1 wherein forming the ring above the paddle and the external interconnect comprises:
    etching a lead frame to form the external interconnect and the paddle; and
    punching the paddle at the boundary to form the ring.

6. A method of manufacture of an integrated circuit package system comprising:
    forming a ground ring with a ring elevation above a paddle and above an external interconnect forming paddle-ring and ring-interconnect gaps of substantially zero between the ring and the paddle, and the ring and the external interconnect, respectively;
    mounting an integrated circuit die on the paddle with an adhesive;
    electrically connecting the integrated circuit die and the external interconnect, the external interconnect and the ground ring, and the ground ring and the integrated circuit die; and
    encapsulating the integrated circuit die, the ring, and a portion of the external interconnect and the paddle.

7. The method as claimed in claim 6 further comprising forming a tie bar to support the ring and the paddle.

8. The method as claimed in claim 6 wherein forming the ground ring above the paddle and the external interconnect includes forming a mold lock with the ground ring.

9. The method as claimed in claim 6 wherein the encapsulating includes exposing a paddle bottom surface.

10. The method as claimed in claim 6 further comprising plating silver on the ground ring.

11. An integrated circuit package system comprising:
    a ring with a ring elevation above a paddle and above an external interconnect having paddle-ring and ring-interconnect gaps of substantially zero between the ring and the paddle, and the ring and the external interconnect, respectively;
    an integrated circuit die on the paddle;
    an interconnect between the integrated circuit die and the external interconnect, between the external interconnect and the ring, and between the ring and the integrated circuit die; and
    an encapsulation to cover the integrated circuit die, the ring, the interconnect, and a portion of the external interconnect and the paddle.

12. The system as claimed in claim 11 wherein the ring above the paddle and the external interconnect includes a paddle-ring gap between a paddle edge and a ring inner side.

13. The system as claimed in claim 11 wherein the ring above the paddle and the external interconnect includes a paddle-ring bend between a paddle edge and a ring inner side.

14. The system as claimed in claim 11 wherein the ring above the paddle and the external interconnect comprises:
    an elevated region of the paddle, the ring formed from the elevated region; and
    a paddle-ring gap between a paddle edge and a ring inner side.

15. The system as claimed in claim 11 wherein forming the ring above the paddle and the external interconnect includes a ring-interconnect gap between the ring and the external interconnect.

16. The system as claimed in claim 11 wherein:
    the ring above the paddle and the external interconnect is a ground ring;
    the integrated circuit die is on the paddle with an adhesive;
    the interconnect between the integrated circuit die and the external interconnect, between the external interconnect and the ring, between the ring connected to the integrated circuit die is a bond wire; and
    the encapsulation to cover the integrated circuit die, the ring, the interconnect, and a portion of the external interconnect and the paddle exposes an external interconnect bottom surface.

17. The system as claimed in claim 16 further comprising a tie bar to support the ring and the paddle.

18. The system as claimed in claim 16 wherein the ground ring above the paddle and the external interconnect is a mold lock.

19. The system as claimed in claim 16 wherein the encapsulation exposes a paddle bottom surface.

20. The system as claimed in claim 16 further comprising silver plated on the ground ring.

* * * * *

UNITED STATES PATENT AND TRADEMARK OFFICE
CERTIFICATE OF CORRECTION

PATENT NO. : 7,671,463 B2 Page 1 of 1
APPLICATION NO. : 11/277991
DATED : March 2, 2010
INVENTOR(S) : Camacho et al.

It is certified that error appears in the above-identified patent and that said Letters Patent is hereby corrected as shown below:

Title page, Item (75) Inventors:
        Delete "Henry D. Bathan, Jr., Singapore (SG);" and insert therefore
        -- Henry D. Bathan, Singapore (SG); --

Signed and Sealed this

Thirteenth Day of April, 2010

David J. Kappos
*Director of the United States Patent and Trademark Office*